US006794296B1

(12) United States Patent
Kassing et al.

(10) Patent No.: US 6,794,296 B1
(45) Date of Patent: Sep. 21, 2004

(54) APERTURE IN A SEMICONDUCTOR MATERIAL, AND THE PRODUCTION AND USE THEREOF

(75) Inventors: Rainer Kassing, Kassel (DE); Christophe Mihalcea, Kassel (DE); Egbert Oesterschulze, Kassel (DE)

(73) Assignee: Universitat Gesamthochschule Kassel, Kassel (DE)

( * ) Notice: Subject to any disclaimer, the term of this patent is extended or adjusted under 35 U.S.C. 154(b) by 0 days.

(21) Appl. No.: 09/786,966

(22) PCT Filed: Sep. 10, 1999

(86) PCT No.: PCT/EP99/06685
§ 371 (c)(1),
(2), (4) Date: Apr. 10, 2001

(87) PCT Pub. No.: WO00/15544
PCT Pub. Date: Mar. 23, 2000

(30) Foreign Application Priority Data

Sep. 12, 1998 (DE) ......................................... 198 41 909
Jun. 11, 1999 (DE) ......................................... 199 26 601

(51) Int. Cl.[7] .......................................... H01L 21/302
(52) U.S. Cl. ....................... 438/706; 438/719; 438/723; 438/745
(58) Field of Search ............................... 438/706, 710, 438/714, 719, 720, 723, 724, 745, 756, 757

(56) References Cited

U.S. PATENT DOCUMENTS

| | | | | |
|---|---|---|---|---|
| 4,954,458 A | * | 9/1990 | Reid ........................... | 438/109 |
| 5,272,913 A | * | 12/1993 | Toda et al. .................... | 73/105 |
| 6,215,114 B1 | * | 4/2001 | Yagi et al. ................... | 250/216 |
| 6,391,259 B1 | * | 5/2002 | Malkin et al. ................. | 422/28 |
| 6,551,842 B1 | * | 4/2003 | Carpenter .................... | 436/518 |

FOREIGN PATENT DOCUMENTS

EP    0 786 642    7/1997

OTHER PUBLICATIONS

Mihalcea et al. "Multipurpose sensor tips for scanning near–field microscopy" Applied Physics Letter, 68(25), Jun. 1996, pp. 3531–3533.*

Mihalcea C. et al. : "Multipurpose Sensor Tips for Scanning Near–Field Microscopy" Applied Physics Letters, U.S., American Institute of Physics.

* cited by examiner

*Primary Examiner*—Kin-Chan Chen
(74) *Attorney, Agent, or Firm*—Baker & Daniels

(57) ABSTRACT

The invention relates to a method for producing an aperture (10) in a semiconductor material (12) comprising the following steps: Preparing a semiconductor wafer (14), for example, a (100)-oriented silicon wafer having an upper surface (16) and a lower surface (18); producing a cavity (20) with a side wall (22) in the upper surface (16) of the semiconductor wafer (14) by partially etching said upper surface (16), whereby the cavity (20) comprises a closed bottom area (24) which faces the lower surface (18) and which preferably has, in particular, a convex or, in particular, a concave corner or edge or a curvature of this type. After depositing an oxide layer (26) on the semiconductor material (12) at least in the area of the cavity (20) by oxidizing the semiconductor material (12), whereby the oxide layer (26) preferably comprises an inhomogeneity (28) in the bottom area (24), the semiconductor material (14) is selectively etched back on the lower surface (18) of the semiconductor wafer (14) until at least the oxide layer (26) located in the bottom area (24) is exposed. Afterwards, the exposed oxide layer (26) is etched until it is at least severed. In addition, the invention relates to an aperture (10) in a semiconductor material (12) especially produced according to the inventive method, and to different uses of such an aperture (10).

29 Claims, 6 Drawing Sheets

APERTURE IN A SEMICONDUCTOR MATERIAL, AND THE PRODUCTION AND USE THEREOF

BACKGROUND OF THE INVENTION

The invention relates to a method for producing an aperture in a semiconductor material, for example (100)-oriented or polycrystalline silicon. Such apertures, whose size is in the micrometer range or below, are used, for example, as a component of probes for scanning near-field optical microscopes (SNOM). With this method, optical surface properties can be inspected with sub-wavelength resolution. As with any other scanning optical microscope, the resolution achievable by the scanning near-field optical microscope is limited by the geometry and the dimensions of the probe, which means in particular, the aperture and its distance from the surface of the sample piece. In order to achieve sub-wavelength resolution the light-emitting or detecting area of the probe must have lateral dimensions below 100 nm. In the prior art, there is no lack of attempts at producing such small dimensioned reproducible apertures in the 100 nm range or below. A method known from the prior art is shown schematically in FIG. 6. FIG. 6a reflects the cross-section through a semiconductor wafer 14 having an upper surface 16 and a lower surface 18. The upper surface 16 comprises a plurality of cavities 20, for example in the form of an inverse pyramid 30, preferably produced by means of anisotropic etching. Thereafter, the lower surface 18 of the semiconductor wafer 14, which consists of (100)-oriented silicon, for example, is etched back, particularly by means of anisotropic etching until the tips of the inverse pyramids are exposed, thus producing an aperture 10, as shown schematically by the first and second illustrations in FIG. 6b. The opening of the first aperture is too wide, the opening of the second aperture is ideal, while in the third example, the tip of the inverse pyramid has not yet opened at all.

This is due to the fact that the thickness of the semiconductor wafer varies highly. Even a variation in the thickness of only a few 10 nm can result in variations in the diameter or the cross-section of the aperture as shown in FIG. 6. This example, which is based on prior art, demonstrates that as a result of the variation in the thickness of the semiconductor wafer 14 only very few tips of the inverse pyramids have a suitable aperture size. Also, the size of said aperture is subject to high scattering.

Furthermore, studies known from the prior art on the oxidation behavior of silicon (Markus et al., Journal of the Electrochemical Society, Solid State Science and Technology, pages 1278–1282, 1982, and Kao et al., IEE Transactions on Electronic Devices, Volume 34, No. 5, page 1008, 1987 and Volume 35, No. 1, page 25, 1988) revealed a high dependence on the orientation in the plane of the semiconductor wafer, on the temperature and the structure of the surface. It was found that at low oxidation temperatures of approx. 800° C. to 900° C. the thickness of the oxide layer on convex and concave edges of the structured surface, for example in trench cells, decreases relative to the thickness of the oxide layer on the surface. These findings have already been used for producing very sharp silicon tips (Marcus et al, Applied Physics letters, 54 (3), pages 236–238, 1990) where curvature radii in the range of approx. 1 nm were achieved. A similar method for producing very sharp silicon tips for the so-called cantilever probes used in scanning probe microscopy is specified in EP-A-0468071.

SUMMARY OF THE INVENTION

Based on a method for producing an aperture in a semiconductor material comprising the steps of preparing a semiconductor wafer, for example a (100)-oriented semiconductor wafer having an upper surface and a lower surface, and producing a cavity with a side wall in the upper surface of the semiconductor wafer by partially etching said upper surface, the aim of the invention is to provide a method for producing an aperture whose size is below approx. 1 micrometer, particularly at approx. 100 nm, where the size of the aperture is adjustable so as to be reproducible.

The problem is solved with the method having the above mentioned characteristic features substantially in that the cavity comprises a closed bottom area, which faces the lower surface and which preferably has, in particular, a convex or, in particular, a concave corner or edge or a curvature of this type, that an oxide layer is deposited on the semiconductor material, at least in the area of the cavity by means of oxidizing the semiconductor material, where the oxide layer comprises an inhomogeneity, at least in the bottom area, that the semiconductor material is selectively etched back on the lower surface of the semiconductor wafer until at least the oxide layer located in the bottom area is exposed, and that the exposed oxide layer is etched until it is at least severed.

The method offers a particular advantage in that the measurement of the size of the aperture is not dependent on the variations in the layer thickness of the semiconductor wafer. The result is that the apertures to be produced are highly reproducible and thus they are able to open up new areas of application and resolutions, for example when they are used in probes in scanning near-field optical microscopy.

A number of procedural steps are performed for producing apertures in semiconductor materials, for example in (100)-oriented mono-crystalline silicon or polycrystalline silicon.

First, particularly pyramidal or other cavities are produced which are tapering at the lower end and which are etched into the semiconductor material. For this purpose, masking layers are provided on the surface of the semiconductor wafer. By means of optical or electron beam lithography and subsequent chemical, electrochemical or plasma etching methods the required structures are applied to the masking layer. The cavities are etched by means of wet-chemical or plasma etching methods. Alternatively, the cavities can also be produced by means of a focused ion beam. In the next step, the semiconductor material is oxidized, where the resulting oxide layer varies depending on the crystal orientation, the oxidation temperature and the curvature of the respective local structure of the surface of the semiconductor wafer. When suitable oxidation temperatures are selected the oxide layer has a higher etching rate in the places with the highest curvature as a result of stress effects, which means that the oxide layer, for example in the case of a tapering cavity, has one or more "weak points" in the area of the tip as relates to the etching process. In the following step, the oxide layer, which may have developed during the oxidation process on the lower surface of the semiconductor wafer, is removed using methods known in the art. Thereafter, the semiconductor material on the lower surface is etched back by wet-chemical etching or plasma etching until finally the tip of the oxide layer located in the cavity is exposed. It is important that a selective etching method is used for this so as to fully or at least largely prevent that the oxide layer is also etched. The semiconductor material is etched back until the single or all of the oxide layers, for example of an array of cavities, are exposed. As a result of variations in the thickness of the semiconductor wafer it is quite possible that the multiple tips, if applicable, of the oxide layer will project to a greater or lesser degree from the lower surface of the semiconductor wafer.

This is not problematic for dimensioning the aperture size, however, insofar as the tips of the oxide layer which project to a greater or lesser degree all have substantially the same form, at least with regard to the thickness and form of the oxide layer, and particularly in the area of the tip, they each have one or more weak points. Thereafter, the oxide layer is thinned with an etching agent, which is selective with regard to the material of the oxide layer, until the oxide layer breaks through on the "weak points" of the oxide layer and the desired apertures are produced in the oxide stumps. The etching process is then discontinued unless larger apertures are desired.

Accordingly, this method produces miniaturized apertures of a well defined size over the entire semiconductor wafer. If the etching process is continued, however, the stump of the oxide layer will also be etched, thereby achieving apertures whose size can be adjusted over the length of the etching process.

There is also an option of providing the cavities with an edge or a plateau in the bottom area so as to produce two or four openings per cavity in the oxide layer in the area of the tips using the above described method.

The reproducibility of the method is based on the knowledge of utilizing the special oxidation properties, for example of (100)-oriented silicon wafers for producing reproducible apertures of identical size over the full substrate surface despite variations in the thickness of the substrate. For this purpose, the substrate comprising the cavity is oxidized at approx. 800° C. to 900° C. so as to produce an oxide layer thickness with an inhomogeneous etching rate and layer thickness.

The oxide is thinnest in the places with the highest curvature, which means that the thinned oxide layer sections are disposed in the area of the tips of the cavities. The oxide layers in the multiple cavities are exposed by selectively etching back the semiconductor material on the lower surface of the semiconductor wafer. The oxide layer is not or only marginally affected by this step. In this phase of the production process, all of the cavities shaped by the oxide layer have an identical oxide layer structure. In particular, the oxide layer structure is independent of variations in the thickness of the semiconductor material. All substantially identical exposed tips of the oxide layer can be thinned or removed in a subsequent step using a selective etching agent, until the oxide layer of all tips breaks through in the same place, i.e. the weak point of the oxide layer, and the tip of the oxide layer breaks off. With this method, apertures having virtually the same size are obtained in all oxide stumps over the entire surface of the semiconductor wafer.

According to an advantageous embodiment of the invention, the cavities have the shape of an inverse pyramid or a V-shaped channel or an inverse pyramid stump or the shape of a plateau.

In particular, a plurality of cavities is disposed, for example in the form of an array, on the surface of the semiconductor wafer.

It is particularly advantageous for the oxide layer to comprise an inhomogeneity in the bottom area in the form of one or more weak points or taperings.

Advantageously, the surface of the oxide layer is subjected to a metallization process, particularly with aluminum, after it has been severed. This offers the option of specifically reducing the aperture which is already present in the oxide layer. Metallization also improves the optical properties of a sensor which is provided with such an aperture.

Advantageously, the diameter of the aperture is in the range of approx. 100 nm or below.

According to another advantageous embodiment of the method, the cavities are preferably produced by means of anisotropic etching.

The oxide layer is produced by means of heating the semiconductor wafer to approx. 900° C., particularly in a humid atmosphere and preferably for approx. 2 hrs.

The semiconductor material is selectively etched back isotropic or anisotropic, for example by means of a KOH solution, in particular approx. 40 percent by weight, preferably at approx. 60° C.

The semiconductor material is preferably selectively etched back until the oxide layers of preferably substantially all or at least most of the cavities of the semiconductor wafer are exposed.

The exposed oxide layer is preferably etched with ammonium fluoride buffer, in particular 1 buffer:16 water.

The size of the aperture is varied so as to be increased substantially by the etching time for the oxide layer after it has been severed.

According to another advantageous embodiment the cavities are configured edge-shaped or plateau-shaped, where two or four apertures are produced per each cavity.

The invention also relates to an aperture in a semiconductor material, which is produced in particular according to any of the procedural claims, where the aperture is formed by an oxide layer located on an inside wall of a breakthrough in the semiconductor material.

According to an embodiment of the invention, a semiconductor layer and/or an organic material layer and/or a metal layer, particularly an aluminum layer, is deposited on the oxide layer.

It was found to be advantageous if the oxide layer is formed of an oxide of the semiconductor material.

The invention also relates to the use of an aperture which is characterized in that the semiconductor material and the aperture are integrated particularly in the front area of a bending arm which is clamped in on one side, particularly a so-called cantilever.

An advantageous embodiment of said use is that a single bending arm or a plurality of bending arms is used as a sensor element in a matrix arrangement.

According to another advantageous embodiment, the bending arm or bending arms are used as sensor elements in scanning probe microscopy.

By depositing a thin, optically low transparent layer, it was found to be advantageous to use the bending arm or bending arms for simultaneous scanning force microscopy (AFM, SFM) or for scanning near-field optical microscopy (SNOM) where, when the aperture is illuminated from the surface of the semiconductor wafer, the aperture is used as a miniaturized light source in the optical near-field range (the so-called illumination mode), or where by the aperture itself luminous power is collected from the illuminated sample piece (the so-called collection mode).

By sequentially depositing materials, such as metal, semiconductors, polymers on the front and/or the rear of the bending arm a miniaturized contact place of the materials is obtained at the place of the aperture.

A further advantageous use is a matrix-like arrangement of apertures, for example in the form of an array on flat substrates or structured surfaces (for example cantilevers), which is used for sorting particles according to size in the manner of a sieve.

Another use is characterized in that a particularly matrix-like arrangement of one or more apertures on flat substrates or on structured surfaces (for example cantilevers) is used for apportioning and/or injecting precise very small amounts of liquid or gas.

Additional characteristic features, advantages, applications and objectives of the invention are found in the following description of exemplary embodiments based on the drawings. All characteristic features which are described and/or graphically depicted separately or in any combination represent the subject matter of the invention, irrespective of any summarization in the claims or references thereto.

DETAILED DESCRIPTION

Figure 6:
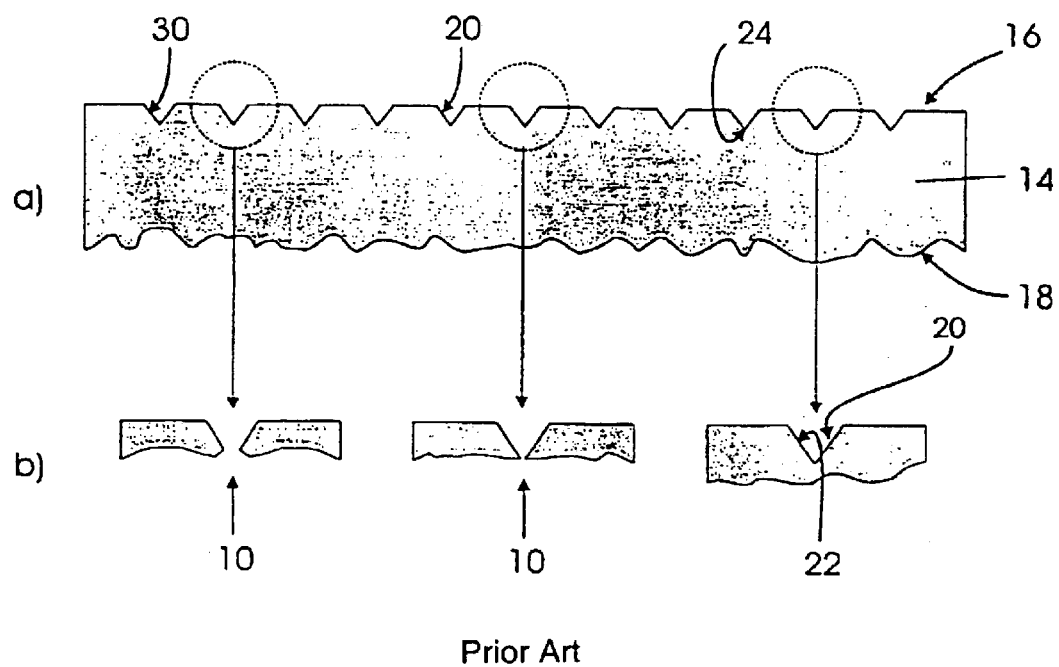
FIG. 6 is a schematic representation of the production of apertures according to the known prior art.

As stated in the introduction, the method as per FIG. 6 based on the prior art for producing apertures 10 is highly sensitive to variations in the thickness of the semiconductor wafer 14, which affect the size of the apertures 10 irrespective of the production method. Said variations in thickness are suggested in FIG. 6a by the wavy lower surface 18 of the semiconductor wafer 14. Following the anisotropic etching of the lower surface 18, the pyramid tip of the inverse pyramid 30 on the left side of FIG. 6b is open very wide to form an aperture 10 because the semiconductor wafer 14 is thinner there than in the following center section, where the thickness of the semiconductor wafer 14 in the schematic illustration of FIG. 6 is selected so as to produce an ideal small aperture 10. In contrast, the thickness of the semiconductor wafer 14 on the right side of FIG. 6b is so thick that the anisotropic etching process on the lower surface 18 did not produce an aperture at all. The above example of a method based on the prior art is intended to illustrate that the variations in the thickness of the semiconductor wafer 14 directly affect the size of the aperture 10 to be produced and cannot be controlled.

Figure 1:
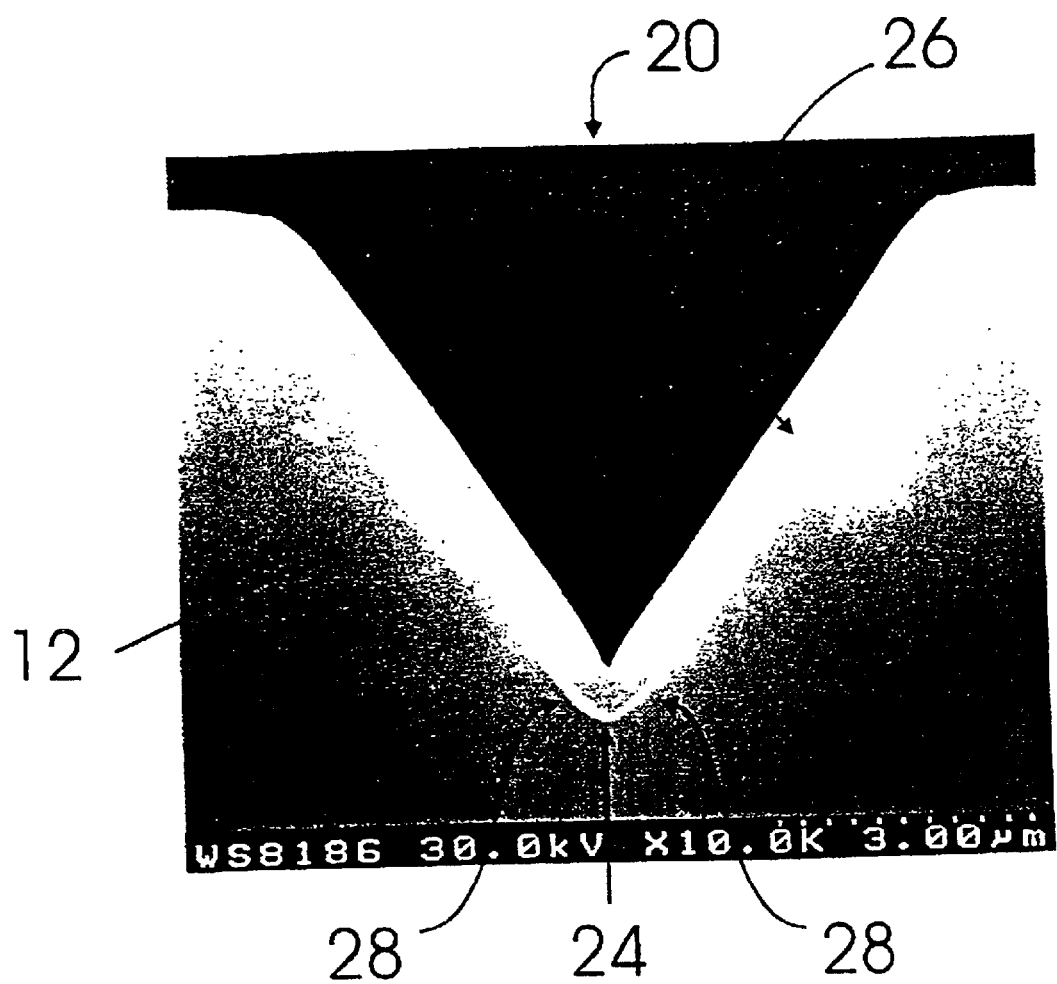
FIG. 1 a cross-section through an anisotropic etched channel structure with deposited oxide layer, FIG. 2 at enlarged scale, a cross-section through the oxidized channel structure of FIG. 1 after the oxide was etched by 75 nm, FIG. 3 a schematic representation of two tips of the oxide layer after etching, where the assumed variation in the thickness of the semiconductor wafer as per FIGS. 3a, b leads to exposed oxide tips, which project to a varying degree from the remaining semiconductor material, but which have an identical aperture size of approx. 150 nm, and FIG. 3c a decrease of the aperture by means of a subsequent metallization process, in schematic representation, FIG. 4 scanning electron microscope photos of oxidized, inverse pyramid arrays, where all procedural steps were completed.
Figure 2:
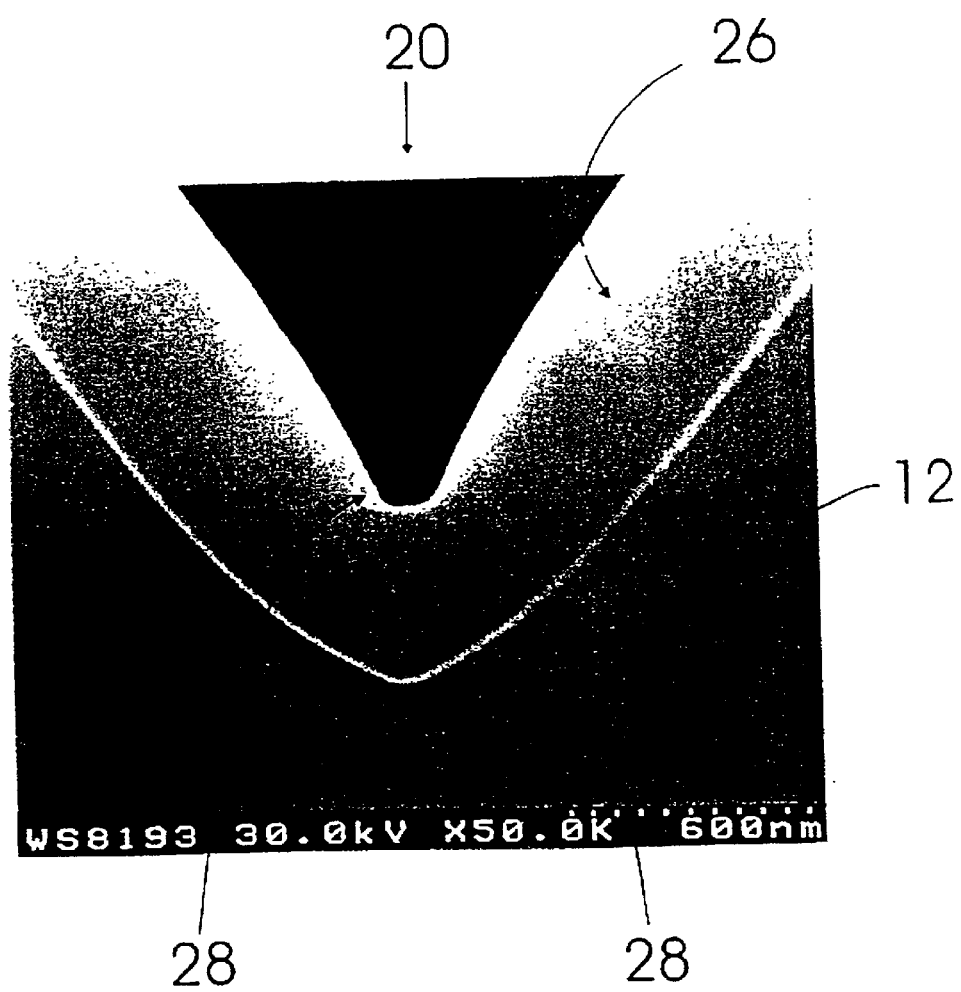

FIGS. 1 and 2 show cross-sections through a channel structure in a (100)-oriented boron doped silicon wafer. First, the silicon wafer is provided with an oxide layer of a few 100 nm and then structured by means of lithography before the channels are etched anistropically. The desired tip height of the aperture sensor is approx. 15 micrometers so that the base width of the channels will be selected between 8 and 30 micrometers and the depth of the channels is between 5 to 6 and 21 micrometers.

Following the anisotropic etching step the oxide remaining on the surface is removed with diluted hydrofluoric acid. Before the actual oxidation process the silicon wafer is optically inspected. Contaminated silicon wafers undergo a standard RCA cleaning, which affects the quality of the subsequently produced thermal oxides.

In order to obtain reproducible results the cleaning is always concluded by briefly dipping the silicon wafer into highly diluted hydrofluoric acid (1 hydrofluoric acid:50 $H_2O$) and subsequently rinsing it thoroughly with fully desalinated water (resistance: 15 M$\Omega$cm). Immediately thereafter, the silicon wafer is transferred to the oxidation furnace to be oxidized at approx. 900° C. in a humid atmosphere for approx. 2 hrs. This method promises the highest stress effects and thus the most inhomogeneous oxide layer thickness.

In order to obtain information with regard to the oxide contours the silicon wafer is broken across the channel structure and inspected with a scanning electron microscope. To increase the contrast between the oxide layer 26 and the semiconductor material 12, for example silicon, the latter is selectively etched back relative to the oxide layer 26 by a few micrometers. It is expected that the oxide layer is thickest on the (111)-wall and has inhomogeneities 28, particularly weak points on the corners where the oxide layer is thinner than on the flat (100)-oriented surface. The oxide layer 26 on the convex corners is generally thicker than the oxide layer on the concave corner at the tip of the inverse pyramid 30. The inhomogeneity 28 or thinning is not located directly below the concave corner. It is located in two areas to the left and the right of the actual tip.

In the process of producing the aperture 10 the oxide layer in the channel structure is thinned isotropically by 75 nm in the next step. The sample piece is then broken again and the semiconductor material 12 or the silicon, respectively, is etched off by a few micrometers so as to improve the contrast. FIG. 2 shows the result following said etching process. Because the etching process is isotropic the area at the tip of the pyramid appears to be widened to approx. 150 nm, i.e. approx. 75 nm in each direction. The inhomogeneities 28 or weak points are even more pronounced than before the etching process in accordance with FIG. 1.

The profiles of the oxide layer 26 as per FIGS. 1 and 2 can be used for producing an aperture 10 if the bottom areas 24 or the tips of the inverse pyramids 30 of the oxide layer 26 can be exposed and then carefully etched isotropically until the inhomogeneities 28 or the weak points of the oxide layer 26 are severed, but the side walls 22 of the pyramid walls remain intact. In order to expose the pyramid-shaped oxide layer 26 the semiconductor material 12 is etched back in the next step. The etching is discontinued when all the tips of the oxide layer 26 project from the remaining thin layer of semiconductor material 12. Because the oxide etching rate in KOH is considerably lower than the etching rate in silicon (oxide: 0.06 micrometers/hr., silicon: 19.9 micrometers/hr.; 40 percent by weight KOH, 60° C.) the oxide layer 26 is not or only marginally affected by the selective etching of the semiconductor material 12 in this step. For pyramids of 20 micrometers height which are fully exposed by etching, the outermost tip of the oxide pyramid is thinned only by approx. 60 nm relative to the base because it is exposed longer to the KOH etching liquid. Variations of 5 micrometers in the substrate thickness will result in variations of merely 50 nm in the oxide thickness of individual pyramids if the oxide etching rate is based on 40 percent by weight KOH at 60° C.

Thereafter, in the next step, the oxide pyramid is carefully etched isotropic by a few nm so that the inhomogeneities 28 or the weak points or the taperings of the oxide layer 26 can be severed, which produces apertures 10 whose dimensions are adjustable so as to be highly reproducible in spite of variations in the thickness of the semiconductor wafer 14.

Figure 3:
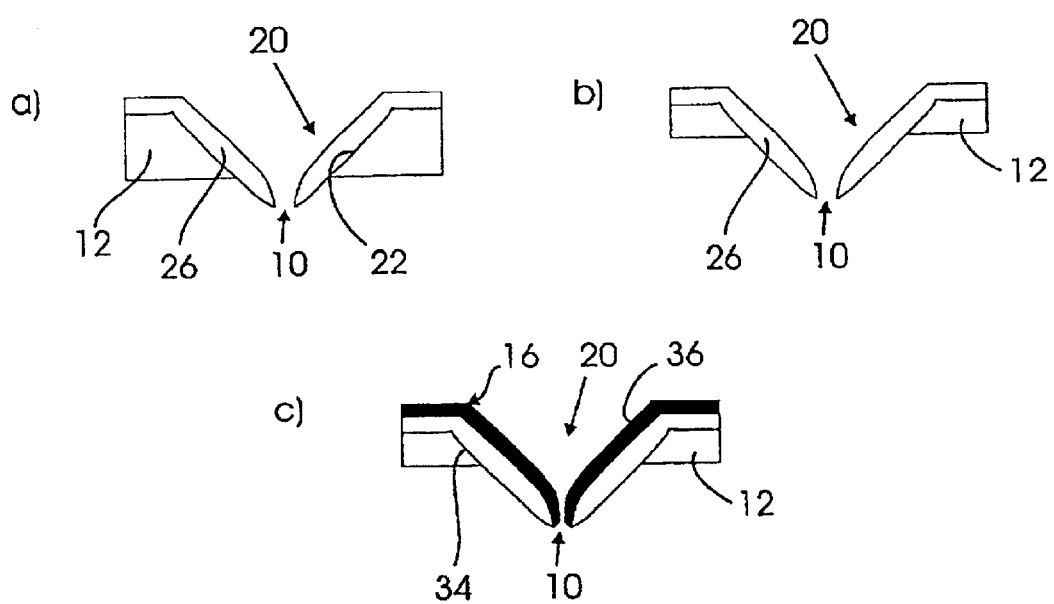

FIG. 3 schematically illustrates the above situation. The geometry of the thickness of the oxide layer 26 as per FIG. 2 shows that minor variations in the thickness of the oxide layer at the tip of the inverse pyramid 30 have virtually no effect on the resulting size of the aperture 10.

Particularly when such apertures 10 are used in optical near-field sensors a metallization is generally required, which is shown in FIG. 3c as a metal layer 36, particularly consisting of aluminum. The application of the metal layer can be used for further reducing the dimensions of the aperture 10. FIGS. 3a and b illustrate that a variation in the thickness of the semiconductor wafer 14 has no effect on the diameter or the size of the aperture 10. The variation in the layer thickness is illustrated by the arrows on the side of the semiconductor material 12, where the diameter of the aperture 10 remains unchanged despite a variation in the layer thickness.

Figure 4:
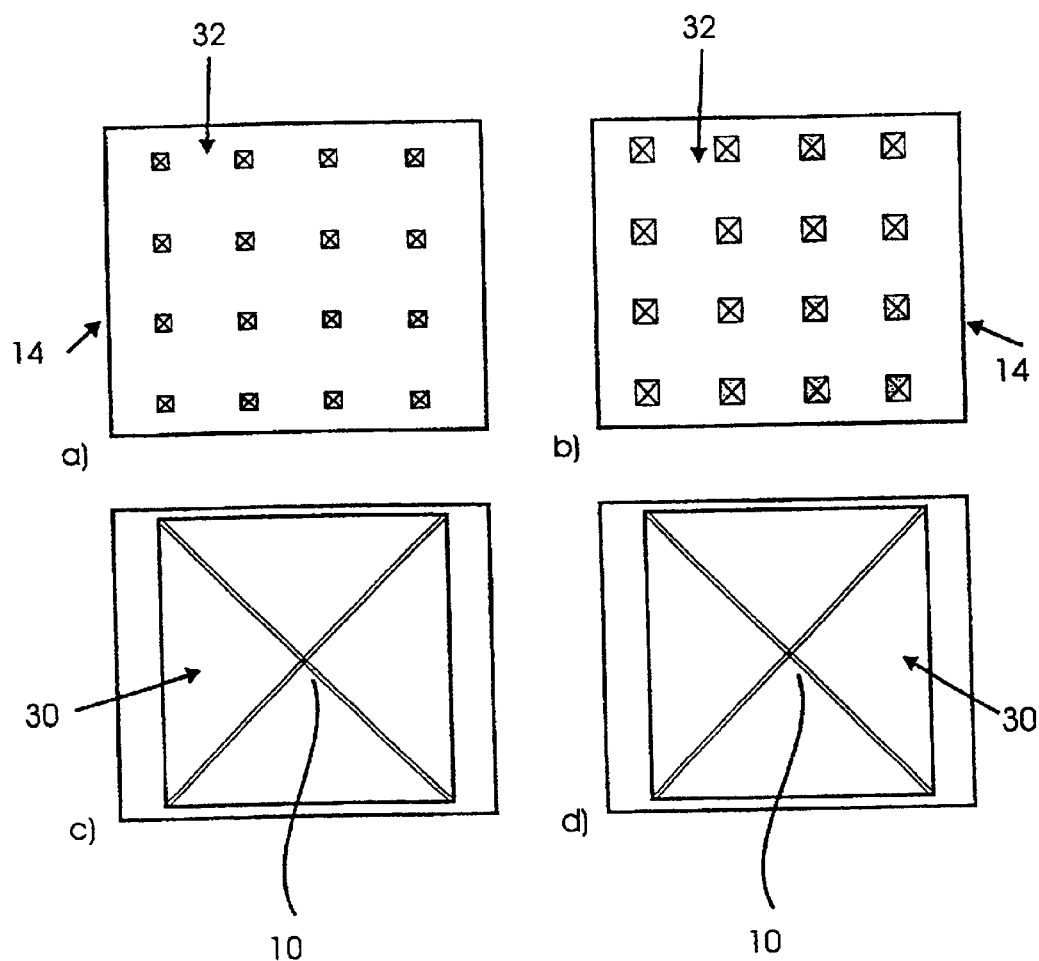
In FIG. 4a, the oxide tips project approx. 4 micrometers out of the remaining semiconductor material, while in FIG. 4b the tips project by approx. 6 micrometers because the semiconductor material was etched longer. This is a quasi simulation of a variation in the thickness of the semiconductor wafer.
FIGS. 4c and 4d are enlarged representations of the outermost tip of an inverse pyramid of the array above as per FIGS. 4a, b. The apertures have a diameter of approx. 160 nm and are largely identical.

FIG. 4 shows scanner electron microscope photos of oxidized inverse pyramid arrays where all steps required for producing the apertures 10 are performed. The pyramid arrays where the cavities 20 are positioned at uniform lateral spacing are, as described above, oxidized, etched and exposed so as to produce bottom areas 24 of the oxide layer 26 which project from the remaining semiconductor material 12 to a varying degree, depending on the variation in the thickness of the semiconductor material 12 or the semiconductor wafer 14.

In order to produce the apertures 10, the oxide layer pyramids are carefully etched until the apertures 10 are produced as a result of severing the inhomogeneities 28 or the weak points of the oxide layer 26. In FIG. 4a, the tips of the oxide layer 26 project from the lower surface 18 by approx. 4 micrometers. In FIG. 4b, the tips project approx. 6 micrometers from the lower surface 18 which is caused by longer etching. This measure essentially simulates a variation in the thickness of the layer of semiconductor material 12 or the semiconductor wafer 14. FIGS. 4c, d each show an enlargement of an inverse pyramid 30 of the array 4a, b above, where apertures 10 were produced in the range of 160 nm by carefully etching the oxide layer 26. Although variations of approx. 2 micrometers in the thickness of the semiconductor wafer 14 were simulated in this example as a result of varying etching rates, the dimensions of the apertures 10 in the cases of FIGS. 4a, c virtually do not vary compared to those in 4b, d. This also provides experimental proof that apertures 10 produced in accordance with the inventive method are highly reproducible with regard to dimensioning the apertures 10 and in particular, that they can be produced regardless of variations in the thickness of the semiconductor wafer 14.

Figure 5:
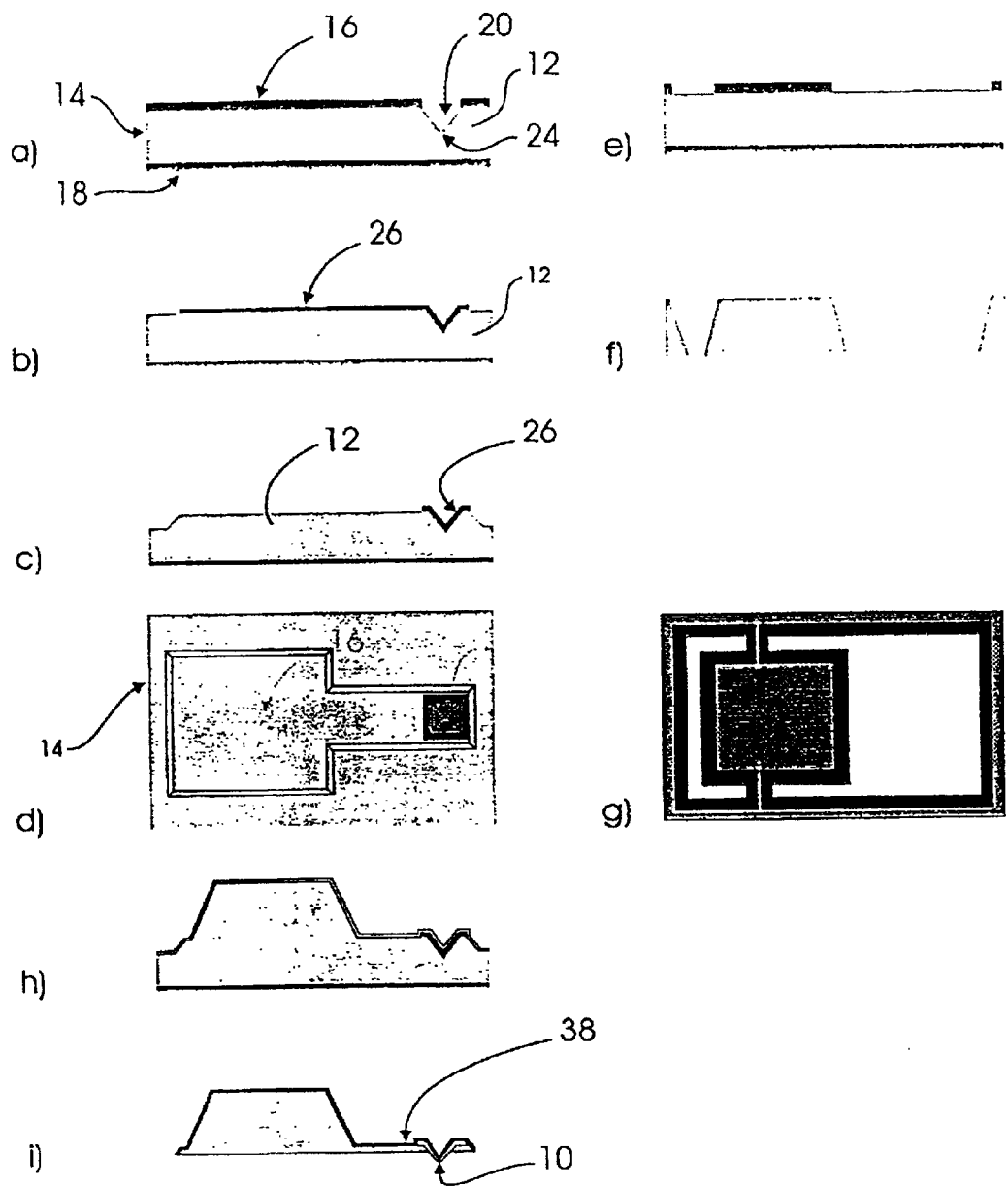
FIG. 5 is a schematic representation of the individual steps of the process for producing the aperture sensor.

FIG. 5 schematically shows the individual steps of the process of producing an aperture sensor. FIG. 5a reflects the definition and the result of the etching process of the inverse pyramid 30. In FIG. 5b, the cantilever or bending arm structure is transferred to the re-oxidized and pre-treated semiconductor wafer 14.

According to FIG. 5c, the surroundings of the bending arm or the cantilever are lowered and the remaining oxide layer 26 is removed, except for the area of the cavity 20. FIG. 5d shows a top view of the semiconductor wafer 14, and the holding element in the oxide layer of a second semiconductor wafer 14 is defined in FIG. 5e. According to FIG. 5f, the holding element which is mounted in a frame is produced by means of anisotropic etching. FIG. 5g shows a top view of the second semiconductor wafer. FIG. 5h is a sectional view showing how the two semiconductor wafers are joined and provided with a silicon nitride layer. FIG. 5i illustrates the separation of the bending arm or the cantilever from the substrate by means of an anisotropic etching step. The silicon nitride layer is removed. A metallization process with aluminum concludes the production process.

The apertures produced in accordance with the inventive method can be used as a starting point for the development of various micro-mechanical elements. Because the size of the opening can be adjusted specifically and reproducibly, for example in an array, it is possible, for example, to use a number of apertures 10 for separating particles according to size in a sieve-like arrangement. Similarly, said apertures 10 can be used for injecting very small amounts of gas or liquid or the like in the fields of medicine, biology and chemistry. Another important application is sensory engineering.

If the openings are integrated into the hollow tip of bending arm probes (cantilevers) the latter can be used as a starting element for developing various probes for measuring various physical and chemical parameters in scanning probe microscopy. Cantilever probes are bending arms which are clamped in on one side having a tip which is integrated at the end of the arm and which scans the surface of a sample piece to be inspected so as to inspect the topography and other physical and/or chemical properties of the sample piece surfaces in a variety of environments, for example in air, vacuum or liquid. For example, a miniaturized opening in a hollow tip can be used for inspecting the optical surface properties on the basis of scanning near-field optical microscopy (SNOM). The tip comprising the opening or aperture can be integrated in a cantilever or adhering to an optical fiber as an element. In order to improve the optical properties the tip-shaped apertures can be reinforced with thin metal tips. For the same purpose, the cavities comprising the openings can be disposed in columns and line by line on bending arms or flat substrates so as to achieve a parallel work mode, for example for parallel image recording or parallel data storage by means of SNOM.

If a tip coated with a material from the top is also coated by the lower surface 18 this allows the development of tiny contacts substantially having the size of the aperture 10. This type of contact can be used in many different ways for sensor elements which are integrated in the tip. A typical example is a metal/metal or metal/semiconductor contact which can be used as a thermoelement for locally measuring temperatures.

If the tip of the oxide layer 26 is provided with a metallic layer by the lower surface 18 the oxide opening can be closed against the top depending on the thickness of the metal layer. In the area of the tip, however, a miniaturized receptacle in the range of attoliters will remain. For electrically insulating said metal layer against its environment a thin dielectric film, for example silicon nitride or silicon oxide, is vapor deposited from the rear of the bending arm. The sensor can then operate in a liquid environment and a galvanic current can be measured by means of the insulated metal layer, which current is present only at the front metallic tip. Said probes, again integrated into tips for example, can be used as probes for an electrochemical inspection of surfaces based on scanning electrochemical microscopy (SECM).

If oxide structures having an edge-like tip structure are produced, two openings can be etched into the tip of the oxide layer or the bottom area 24, if required. In this case, the two apertures 10 are separated by an oxide bridge. Said miniaturized bridge can be coated with another material, for example metal, semiconductor materials, organic materials or the like, which easily produces a bar-shaped, miniaturized electric conductor. Said arrangement can be used for scanning thermal microscopy (SThM), for example, in that the temperature-dependent resistance of the strip conductor is used for measuring the local temperature of the sample piece.

If oxide structures are produced having a plateau-like structure on the tapering side of the stump of the oxide layer 26 four openings can be etched into the tip of the oxide layer 26, if required. In this case, the four openings are separated by a cross-shaped oxide structure. Said miniaturized cross can then be coated with another material, for example metal, semiconductor materials, organic materials or the like, and used as a miniaturized hollow probe for measuring magnetic fields. Another option is using the matrix-like arrangement of the apertures 10 on flat substrates or the tips or bottom areas 24 on structured surfaces, for example cantilevers, for injecting very small, precisely apportioned amounts of liquid.

Overall, the advantage of the invention is having developed a method allowing that on each tip or in each bottom area 24 of the oxide layer 26 the size of the aperture 10 to be produced can be specifically determined. This is achieved in that due to the stress in the oxide layer 26 at the tip, i.e. in the area of highest curvature, a locally defined, higher etching rate can be obtained. Accordingly, by specifically selecting the etching time the etched thickness of the oxide layer in the area of the tip or in the bottom area 24 can be determined so that variations in the thickness of the semiconductor wafer 14 have no effect on the size of the aperture 10.

REFERENCE LIST 10 aperture
12 semiconductor material
14 semiconductor wafer
16 upper surface
18 lower surface
20 cavity
22 side wall
24 bottom area
26 oxide layer
28 inhomogeneity
30 inverse pyramid
32 array
34 inside wall
36 metal layer
38 bending arm

What is claimed is:

1. Method for producing an aperture (10) in a semiconductor material (12) comprising the following steps:
   preparing a semiconductor wafer (14) having an upper surface (16) and lower surface (18),
   producing a cavity (20) with oriented side walls (22) in the upper surface (16) of the semiconductor wafer (14) by means of partially etching said upper surface (16) anisotropically, wherein the cavity (20) comprises a closed bottom area (24) facing the lower surface (18) having a convex or concave corner or edge separating at least two side walls with different orientation,
   depositing an oxide layer (26) on the semiconductor material (12) at least in the bottom area of the cavity (20) by oxidizing the semiconductor material (12), where the oxide layer (26) at least in the bottom area (24) comprises an inhomogeneity (28) located in the proximity of the convex or concave corner or edge,
   selectively etching back the semiconductor material (12) on the lower surface (18) of the semiconductor wafer (14) until at least the oxide layer (26) located in the bottom area (24) is exposed, and
   etching the exposed oxide layer (26) until it is at least severed at the inhomogeneity (28) thereby producing an aperture (70) having a size which is substantially determined by the location of the inhomogeneity (28).

2. Method according to claim 1, characterized in that the cavity (20) has the shape of an inverse pyramid (30) or of a V-shaped channel or an inverse pyramid stump or a plateau form.

3. Method according to claim 1, characterized in that a plurality of cavities (20) is produced on the upper surface (16) of the semiconductor wafer (14).

4. Method according to claim 3, characterized in that the semiconductor material (12) is selectively etched back until the oxide layers (26) of at least most of the cavities (20) are exposed.

5. The method of claim 3 wherein the cavities are in the form of an array.

6. Method according to claim 1, characterized in that the oxide layer (26) in the bottom area (24) comprises one or more weak points or taperings as an inhomogeneity.

7. Method according to claim 1, characterized in that the oxide layer (26) after being severed is subjected to a metallization process.

8. The method of claim 7 wherein the metallization process is conducted with aluminum.

9. Method according to claim 1, characterized in that the average diameter of the aperture (10) is in the range of approx. 100 nm or below.

10. Method according to claim 1, characterized in that the cavities (20) are produced by means of anisotropic etching.

11. Method according to claim 1, characterized in that the oxide layer (26) is produced by heating the semiconductor wafer (14) to approx. 900° C., in a humid atmosphere for approx. 2 hrs.

12. Method according to claim 1, characterized in that the semiconductor material (12) is selectively etched back isotropically or anisotropically by means of a KOH solution.

13. The method of claim 12 wherein the solution is about 40 percent by weight KOH.

14. The method of claim 12 wherein the solution is about 60 percent by weight KOH.

15. Method according to claim 1, characterized in that the exposed oxide layer (26) is etched with ammonium fluoride buffer.

16. The method of claim 15 wherein the buffer is in water with a ratio of 1:16 buffer to water.

17. Method according to claim 1, characterized in that the size of the aperture (10) is variable so as to be increased substantially by the etching time of the oxide layer (26) after it has been severed.

18. Method according to claim 1, characterized in that the cavity (20) is configured plateau-shaped.

19. The method of claim 1 wherein the semiconductor wafer is a (100)-oriented wafer.

20. Aperture (10) in a semiconductor material (12) produced in particular in accordance with a method as per claim 1, characterized in that the aperture (10) is formed by an oxide layer (26) located on an inside wall (34) of a breakthrough in the semiconductor material (12).

21. Aperture in a semiconductor material according to claim 20, characterized in that at least one of a semiconductor layer, an organic material layer and a metal layer (36) is deposited on the oxide layer (26).

22. Aperture according to claim 20, characterized in that the oxide layer (26) is formed of an oxide of the semiconductor material (12).

23. Use of an aperture according to claim 20, characterized in that the semiconductor material (12) comprising the aperture (10) is integrated in the front area of a bending arm (38) which is clamped in on one side in cantilever fashion.

24. Use according to claim 23, characterized in that the single bending arm (38) or a plurality of bending arms (38) is used in a matrix arrangement as a sensor element or sensor elements, respectively.

25. Use according to claim 23, characterized in that the bending arm or bending arms (38) are used as sensor elements for scanning probe microscopy.

26. Use according to claim 23, characterized in that by depositing a thin, optically transparent layer the bending arm is used for simultaneous scanning force microscopy (AFM, SFM) or for scanning near-field optical microscopy (SNOM), where by illuminating the aperture (10) from the upper surface (16) of the semiconductor wafer (14) the aperture (10) is used as a miniaturized light source in the optical near-field range (so-called illumination mode) or luminous power is collected by the aperture (10) from the illuminated sample piece (so-called collection mode).

27. Use according to claim 23, characterized in that by sequentially depositing a material selected from the group consisting of metals, semiconductors and polymers on the upper surface (16) and lower surface (18) of the bending arm (38) a miniaturized contact placement of the materials is achieved at the place of the aperture (10).

28. Use of an aperture (10) according to claim 20, characterized in that a matrix-like arrangement of multiple apertures (10) on flat substrates or on structured surfaces, is used for sorting particles according to size in the manner of a sieve.

29. Use of an aperture (10) according to claim 20, characterized in that a matrix-like arrangement of one or more apertures (10) on flat substrates or on structured surfaces is used for apportioning and/or injecting precise, very small amounts of liquid or gas.

* * * * *